United States Patent [19]
Trinh et al.

[11] Patent Number: 5,434,519
[45] Date of Patent: Jul. 18, 1995

[54] SELF-RESETTING CMOS OFF-CHIP DRIVER

[75] Inventors: Thanh D. Trinh; Satyajit Dutta, both of Travis County, Tex.; Stanley E. Schuster, Westchester, N.Y.; Tai A. Cao, Williamson County; Thai Q. Nguyen, Travis County, both of Tex.

[73] Assignee: International Business Machines Corporation, Armonk, N.Y.

[21] Appl. No.: 321,641

[22] Filed: Oct. 11, 1994

[51] Int. Cl.⁶ ............... H03K 19/094; H03K 19/02
[52] U.S. Cl. ........................ 326/83; 326/86; 326/17; 326/58
[58] Field of Search ............... 326/83, 86, 68, 17, 326/27, 58; 327/34, 166, 174, 176, 206

[56] References Cited

U.S. PATENT DOCUMENTS

| | | |
|---|---|---|
| 4,806,797 | 2/1989 | Yamazaki . |
| 4,980,580 | 12/1990 | Ghoshal . |
| 5,023,488 | 6/1991 | Gunning . |
| 5,194,764 | 3/1993 | Yano et al. ............... 326/86 |
| 5,315,172 | 5/1994 | Reddy ............... 326/27 |
| 5,315,187 | 5/1994 | Cheng ............... 326/27 |
| 5,346,243 | 9/1994 | McClure ............... 327/208 |

FOREIGN PATENT DOCUMENTS 253723 10/1988 Japan .

OTHER PUBLICATIONS

IBM Technical Disclosure Bulletin vol. 30, No. 2, Jul. 1987 by J. S. Mitby, et al, entitled "CMOS Driver Circuit", pp. 770–771.

IBM Technical discosure Bulletin vol. 31, No. 3, Aug. 1988 by T. Sunaga, entitled "Off–Chip Driver for Continuous Read Acess", pp. 318–320.

IBM Technical Disclosur Bulletin vol. 33, No. 7, Dec. 1990 by A. Correale, Jr., entitled "Circuit Scheme to Improve Chip Data Hold Time".

*Primary Examiner*—Edward P. Westin
*Assistant Examiner*—Richard Roseen
*Attorney, Agent, or Firm*—Whitham, Curtis, Whitham & McGinn; Mark McBurney

[57] ABSTRACT

A self-resetting CMOS off-chip diver includes a first pair of complementary FETs connected in series to receive first and second complementary drive signals from an on-chip source. A latch is connected to an output of the first pair of complementary FETs for latching said drive signals. The first pair of complementary FETs in combination with the latch form a unique "pulse catcher" circuit capable of catching and latching short duration pulses characteristic of the self-resetting (SR) mode, providing the transfer between the SR mode and the output static mode. A low power three state static driver circuit is comprised of first and second pass gates connected to pass an output of the latch and a second pair of complementary FETs respectively connected to receive outputs of the first and second pass gates to generate a static output for driving a transmission line. Pull-up and pull-down devices are connected to respective inputs of the second pair of complementary FETs and controlled by the control means to provide a three state function output. The three state static circuit provides high speed data transfer with a high drive capability full swing signal output. An enable circuit implementing four enable functions, including a testability function, is connected to the first and second pass gates to inhibit an output to the second pair of complementary FETs in the test mode. Pull-up and pull-down devices are connected to respective inputs of the second pair of complementary FETs and controlled by the enable circuit to provide the three state function output, including a high impedance state.

6 Claims, 2 Drawing Sheets

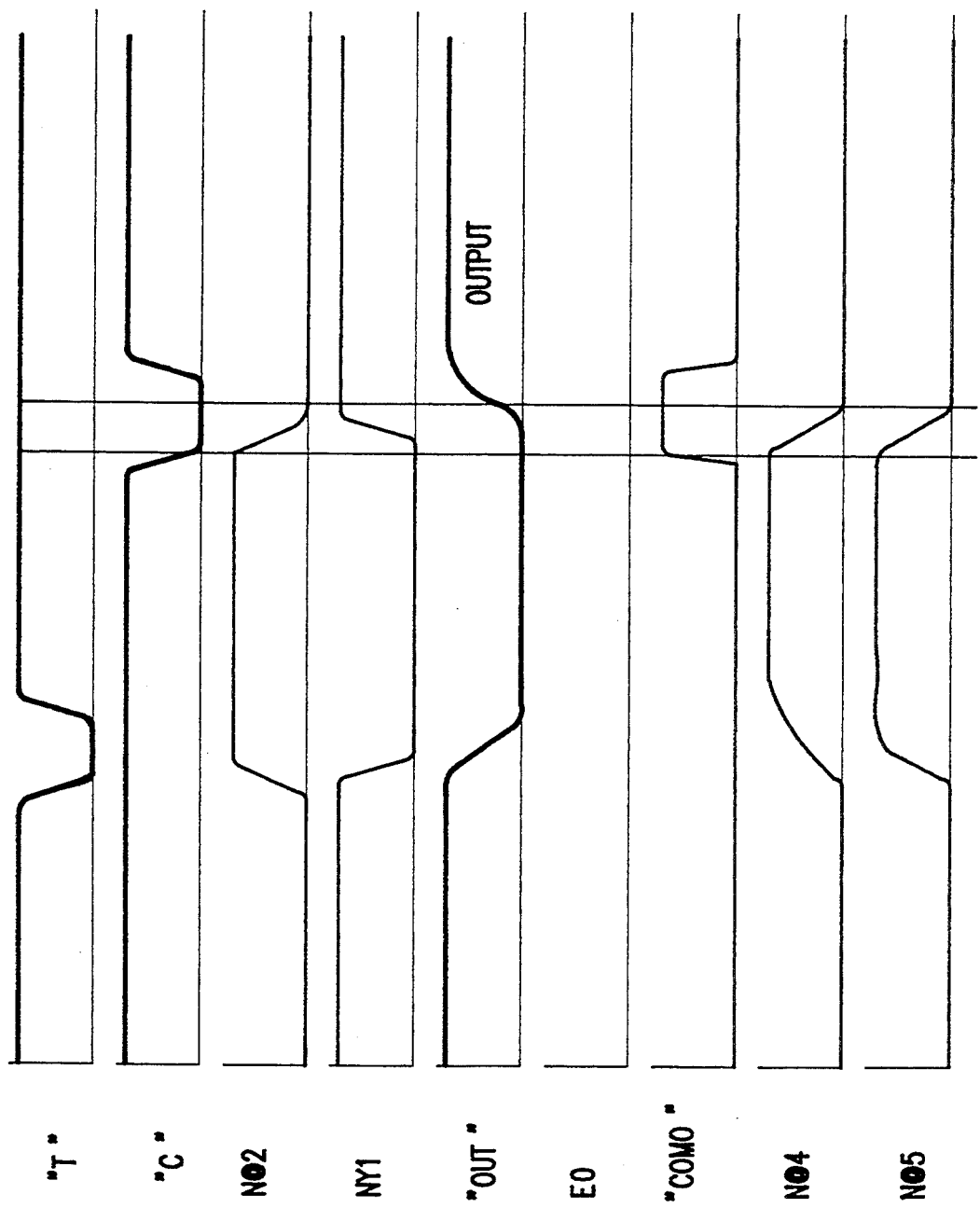

5,434,519

SELF-RESETTING CMOS OFF-CHIP DRIVER

BACKGROUND OF THE INVENTION

1. Field of the Invention

The present invention generally relates to signal level conversion circuits and, more particularly, to a complementary metal oxide semiconductor (CMOS) off-chip driver circuit which is able to convert signals from self-resetting logic to a pseudo static output format that provides for increased data valid window.

2. Description of the Prior Art

In the self-resetting CMOS (SRCMOS) circuit design, the set and reset devices are designed and driven separately. To send signals off-chip, especially for the case of a half-cycle net which is connected between a central processing unit (CPU) and a storage control unit (SCU), the off-chip driver (OCD) should be able to convert the self-resetting signals into a static signal. In addition, the driver also should be designed to have a good performance to meet the challenging half-cycle time. Finally, the driver should be able to carry the testing requirements as specified.

SUMMARY OF THE INVENTION

It is therefore an object of the present invention to provide a very high speed self-resetting CMOS application for off-chip driver design.

According to the invention, there is provided a self-resetting CMOS off-chip driver which includes a first pair of complementary FETs connected in series to receive first and second complementary drive signals from an on-chip source. A latch is connected to an output of the first pair of complementary FETs for latching said drive signals. The first pair of complementary FETs in combination with the latch form a unique "pulse catcher" circuit capable of catching and latching short duration pulses characteristic of the self-resetting (SR) mode. This pulse catcher circuit is important to make the transfer between the SR mode and the output static mode, and because it is implemented with a minimum number of devices, it has low power consumption and saves space. A low power three state static driver circuit is comprised of first and second pass gates connected to pass an output of the latch and a second pair of complementary FETs which respectively receive outputs of the first and second pass gates to generate a static output for driving a transmission line. This three state static driver circuit provides high speed data transfer with a high drive capability full swing signal output. An enable circuit implementing four enable functions, including a testability function, is connected to the first and second pass gates to inhibit an output to said second pair of complementary FETs in the test mode. Pull-up and pull-down devices are connected to respective inputs of the second pair of complementary FETs and controlled by the enable circuit to provide the three state function output, including a high impedance state.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a timing chart illustrating the operation of the circuit shown in FIG. 1.

DETAILED DESCRIPTION OF A PREFERRED EMBODIMENT OF THE INVENTION

Figure 1:
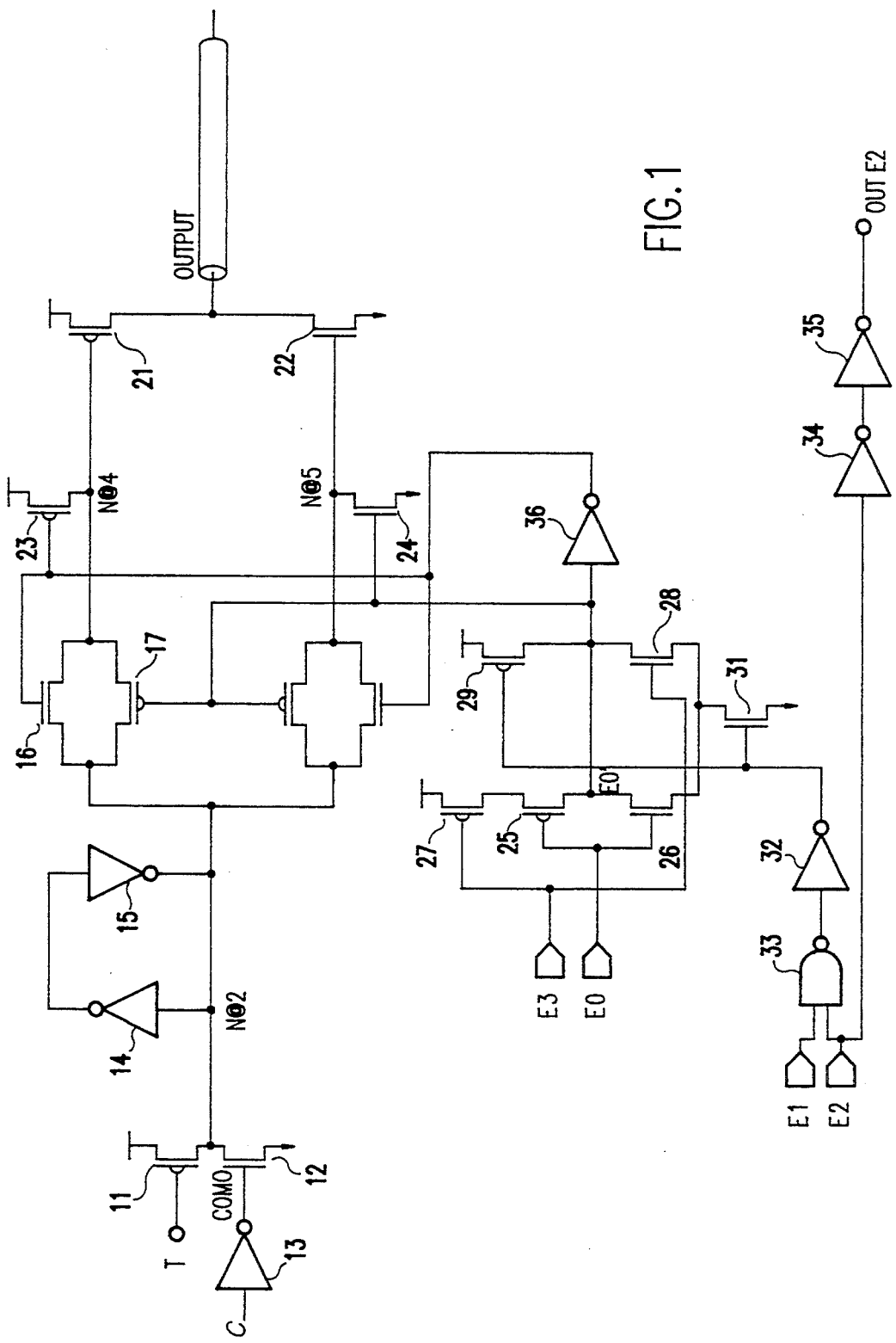
FIG. 1 is a schematic diagram of the self-resetting CMOS off-chip driver circuit according to the invention.

Referring now to the drawings, and more particularly to FIG. 1, there is shown the circuit of the off-chip driver according to the preferred embodiment of the invention. A p-channel field effect transistor (FET) 11 is connected in series with an n-channel FET 12 between a voltage source $V_{DD}$ and circuit ground. The input to the gate of FET 11 is a negative going signal T. A positive going signal C is first inverted by inverter 13 and then applied to the gate of FET 12. Both the T and C signals are small pulses which are the typical outputs of self-resetting circuits. The common source connection of FETs 11 and 12 is connected to the cross-coupled inverter pair 14 and 15 which functions as a latch. The FETs 11 and 12 and the inverter pair 14 and 15 function as a "pulse catcher" circuit which is capable of catching and latching a pulse of as short a duration as 200 pico seconds (ps). This unique pulse catcher circuit is what provides the transfer from self-resetting (SR) mode to static mode. Because the circuit is implemented with few devices, it takes a minimum amount of space and has a low power consumption.

The common source connection of FETs 11 and 12 is also connected to a three state static driver circuit comprising two pass gate buffers respectively comprising complementary FETs 16, 17 and FETs 18, 19. The output of the first pass gate buffer comprising FETs 16, 17 is connected to the gate of p-channel FET 21, while the output of the second pass gate buffer comprising FETs 18, 19 is connected to the gate of n-channel FET 22, these two FETs being connected in series between voltage source $V_{DD}$ and circuit ground. The common source connection of the FETs 21, 22 providing the off-chip output of the circuit. A pull up p-channel FET 23 is connected with its drain connected to the gate of FET 21 and its source connected to voltage source $V_{DD}$. The gate of FET 23 is connected in common with the gates of FETs 16 and 19 to a first control line. A pull down n-channel FET 24 is connected with its drain connected to the gate of FET 22 and its source connected to circuit ground. The gate of FET 24 is connected in common with the gates of FETs 17 and 18 to a second control line. An enable circuit having four enable functions, including a testability function, generates the signals on the first and second control lines.

The enable circuit receives four inhibit signals E0, E1, E2, and E3. The first inhibit signal E0 is applied in common to the gates of p-channel FET 25 and n-channel FET 26 having a common source connection. Inhibit signal E3 is applied in common to the gates of p-channel FET 27 and n-channel FET 28. The source of FET 27 is connected to the voltage source $V_{DD}$, and the drain of FET 27 is connected to the source of FET 25. The FET 28 has a common source connection with p-channel FET 29, which has its source connected to voltage source $V_{DD}$. The sources of FETs 26 and 28 are connected in common with the drain of n-channel FET 31, having its source connected to circuit ground. The gates of FETs 29 and 31 are connected in common to the output of inverter 32. The input to inverter 32 is the output of a NAND gate 33 having as its inputs inhibit signals E1 and E2. Inhibit signal E2 is also applied to cascaded inverters 34 and 35. OUTE2 is used to control chip simultaneous switching noise during testing. The common source/drain connection of FETs 25, 26 and FETs 29, 28 provide the output of the second control line, and inverter 36 provides the output of the first control line.

The operation of the circuit is illustrated by the timing diagram shown in FIG. 2. The four inhibit signals E0, E1, E2, and E3 and the pull up and pull down transistors 23 and 24 form a three state function to perform the testing requirements. The "true" and the "complement" signals, so called "bubbles", have pulse width of about 600 ps or equivalent to the $3 \times T_r$, where $T_r$ is the transition time. The falling edges of these signals control the static output switching of the off-chip driver. When "C" is high and "T" switches from high to low, FET 11 is on and FET 12 is off and the signal travels through FET 11. The two inverters 14 and 15 connected in series at the output of FETs 11 and 12 are used as the latch to hold signal while both the "T" and "C" are high. Another feature of the circuit is to convert SRCMOS signals into static mode. Assuming E0, E1, and E2 are high and E3 is low (enable mode), the pull up device FET 23 and the pull down device FET 24 are off, the FET 21 is off, the FET 22 is on and switches signal from high to low. When "T" is high and "C" switches from high to low the FET 11 transistor is off, the FET 12 is on, the signal travels through the pass transistors 16, 17 and 18, 19. Again, the pull up and pull down FETs 23 and 24 are off; FET 22 is off and FET 21 is on and the signal is switched from low to high.

Again, the four driver inhibit inputs E0, E1, E2, and E3 are necessary for testing. The following is the truth table for the inhibit inputs of OCD and the definitions for these inhibit signals:

| E0 | E1 | E2 | E3 | DATA OUT |
|----|----|----|----|----------|
| X  | 0  | X  | X  | HI Z |
| X  | 1  | 1  | 1  | DATA IN (PKG TEST) |
| 0  | 1  | 1  | 0  | HI Z (DISABLE OCD) |
| 1  | 1  | 1  | 0  | DATA IN (FUNCTIONAL) | where X means "don't care". E0 is a function driver enable input defined by system functional requirements, E1 is used for system mode, E2 is used by component test and power on time controlled by a chip pin, and E3 is used for package level testing along with E0 and E2. The performance of this self-resetting driver is about 400 ps for the typical case. See FIG. 2 for delay measurement.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A self-resetting CMOS off-chip driver comprising:
   a first pair of complementary FETs connected in series for receiving first and second complementary drive signals from an on-chip source;
   a latch connected to an output of said first pair of complementary FETs for latching said drive signals, said first pair of complementary FETs and said latch functioning as a pulse catcher circuit to catch and latch short duration pulses and provide a static output; and
   a static driver circuit comprising first and second pass gates connected to pass an output of said latch and a second pair of complementary FETs connected in series and respectively receiving outputs of said first and second pass gates to provide high speed data transfer with a high drive capability full swing signal output for driving a transmission line.

2. The self-resetting CMOS off-chip driver recited in claim 1 further comprising an enable circuit connected to said first and second pass gates for inhibiting/enabling an output to said second pair of complementary FETs in a functional mode in bidirectional nets and inhibiting an output to said second pair of complementary FETs in a test mode.

3. The self-resetting CMOS off-chip driver recited in claim 2 further comprising pull-up and pull-down devices connected to respective inputs of said second pair of complementary FETs and controlled by said enable circuit to provide a three state function output.

4. The self-resetting CMOS off-chip driver recited in claim 2 further comprising means for controlling simultaneous switching noise on the chip.

5. The self-resetting CMOS off-chip driver recited in claim 1 wherein said pulse catcher and pass gates insert minimal delay of output drive signals in response to said first and second complementary drive signals from the on-chip source.

6. The self-resetting CMOS off-chip driver recited in claim 5 wherein said enable circuit is outside a path of the output drive signals resulting in no delay to the output drive signals.

* * * * *